(12) United States Patent
Nagano et al.

(10) Patent No.: US 7,095,023 B2
(45) Date of Patent: Aug. 22, 2006

(54) CHARGED PARTICLE BEAM APPARATUS, CHARGED PARTICLE DETECTION METHOD, AND METHOD OF MANUFACTURING SEMICONDUCTOR DEVICE

(75) Inventors: Osamu Nagano, Kanagawa (JP); Atsushi Ando, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/969,856

(22) Filed: Oct. 22, 2004

(65) Prior Publication Data

US 2005/0139789 A1    Jun. 30, 2005

(30) Foreign Application Priority Data

Oct. 23, 2003    (JP)    ............................. 2003-363242

(51) Int. Cl.
H01J 37/08    (2006.01)
(52) U.S. Cl. .................................................... 250/310
(58) Field of Classification Search ................. 250/310
See application file for complete search history.

(56) References Cited

U.S. PATENT DOCUMENTS 4,933,552 A * 6/1990 Lee ............................ 250/310
4,958,079 A * 9/1990 Gray .......................... 250/397
6,940,080 B1* 9/2005 Nagano et al. ......... 250/492.23
2003/0201391 A1* 10/2003 Shinada et al. ............. 250/307
2005/0139789 A1* 6/2005 Nagano et al. ......... 250/492.23

FOREIGN PATENT DOCUMENTS

| JP | 63-175325 | 7/1988 |
| JP | 06-243814 | 9/1994 |
| JP | 11-162384 | 6/1999 |

* cited by examiner

*Primary Examiner*—Kiet T. Nguyen
*Assistant Examiner*—James J. Leyboourne
(74) *Attorney, Agent, or Firm*—Finnegan, Henderson, Farabow, Garrett & Dunner, L.L.P.

(57) ABSTRACT

A charged particle beam apparatus includes: a charged particle beam source which generates a charged particle beam to irradiate the charged particle beam onto a specimen; a demagnification optical system which demagnifies the charged particle beam; a deflector which deflects the charged particle beam to scan the specimen; and a first charged particle detector having a detection surface to detect a charged particle generated from the specimen which has been irradiated with the charged particle beam; wherein the detection surface of the first charged particle detector is disposed so as to face towards the charged particle beam source.

19 Claims, 13 Drawing Sheets

CHARGED PARTICLE BEAM APPARATUS, CHARGED PARTICLE DETECTION METHOD, AND METHOD OF MANUFACTURING SEMICONDUCTOR DEVICE

CROSS REFERENCE TO RELATED APPLICATION

This application claims benefit of priority under 35USC §119 to Japanese Patent Application No. 2003-363242, filed on Oct. 23, 2003, the contents of which are incorporated by reference herein.

BACKGROUND OF THE INVENTION

1. Field of the Invention

The present invention relates to a charged particle beam apparatus, a charged particle detection method, and a method of manufacturing a semiconductor device.

2. Related Background Art

Various methods have been proposed for increasing the efficiency of detection of secondary electrons generated from the surface of a specimen in a scanning electron microscope, such as a method of disposing a micro channel plate (MCP) detector and a metal casing to which a negative potential is applied, in a lower portion of the objective lens (such as that disclosed in Japanese Patent Laid-Open No. 63-175325) and a method of disposing an MCP detector in an upper portion of the objective lens (such as that disclosed in Japanese Patent Laid-Open No. 06-243814 and Japanese Patent Laid-Open No. 11-162384). Note that the terminology is used in this document so that "charged particles" has a broad meaning that includes reflected charged particles and "secondary electrons" has a broad meaning that includes reflected electrons, as long as they are not particularly mentioned otherwise.

The charged particle detection device proposed in Japanese Patent Laid-Open No. 63-175325 is provided with an MCP detector to detect secondary electrons and a metal casing in a lower portion of the objective lens that focuses the electron beam onto the wafer W to irradiate it. Secondary electrons that are generated from a position on the wafer that has been irradiated by the electron beam are drawn in the direction of the optical axis by the magnetic field of the objective lens 65, but these secondary electrons are repelled by the electrical field generated by the negative potential (of −50 to −150 V) that is applied from a power source to the metal casing, to follow a trajectory that detours even further below the lower edge of the metal casing and be detected by the lower surface of the MCP detector.

The scanning electron microscope disclosed in Japanese Patent Laid-Open No. 06-243814 comprises two electron detectors disposed so as to sandwich the objective lens, making it possible to detect secondary electrons (where "secondary electrons" is used in the narrower sense, excluding reflected electrons) and reflected electrons simultaneously, by detecting the secondary electrons (in the narrower sense) emitted from the wafer by the electron detector on the scan deflector side and detecting the reflected electrons emitted from the wafer by the electron detector on the wafer side.

In the scanning electron microscope disclosed in Japanese Patent Laid-Open No. 11-162384, the secondary electrons emitted from the wafer are accelerated between the wafer and the objective lens immediately after emission by an electrical field that draws them out on the electron gun side, in a state in which a negative potential (a retarding potential) is applied to the wafer, making it difficult to detect them at a lower portion of the objective lens. For that reason, a Wien filter is provided between the objective lens and the MCP detector disposed on the upstream side thereof, to excite an orthogonal electromagnetic field by this Wien filter. The deflection force with respect to the primary electron beam is canceled by this orthogonal electromagnetic field, but the deflection force with respect to the secondary electrons generated from the wafer and traveling through the objective lens is not canceled thereby so that the secondary electrons are deflected away from the optical axis and thus can be detected by the MCP detector that is disposed around the perimeter of the optical axis.

However, the above-described detection methods have problems, as discussed below.

Specifically, the effect of the method disclosed in Japanese Patent Laid-Open No. 63-175325 only occurs with an optical system in which the distance from the objective lens to the wafer is sufficiently long and the negative potential applied to the metal casing is comparatively large (−50 to −150 V), which lead to blurriness of the focus.

If an electron beam is accelerated to a high acceleration and strikes a resist on the wafer, the proximity effect occurs, in which the irradiating electron beam is reflected by the various thin films formed in the lower surface of the resist on the upper surface of the wafer and is again directed upward from the resist. Since this causes deterioration in the focus and resolution of the drawing pattern, a charged particle beam lithography apparatus employing a shaping aperture method using an electron beam with a low-acceleration voltage has been proposed recently. In this low-acceleration voltage type of charged particle beam lithography apparatus, loss of focus of the beam due to the space charge effect becomes a problem, and thus it is essential to reduce the dimensions of the optical system in order to reduce this loss of focus. With the detection methods disclosed in Japanese Patent Laid-Open No. 06-243814 and Japanese Patent Laid-Open No. 11-162384, the MCP detector is disposed above the objective lens, making it necessary to provide sufficient distance between the wafer and the MCP detector in both methods. For that reason, these methods cannot be applied to a low-acceleration voltage type of charged particle beam lithography apparatus in which the optical system must be compact.

BRIEF SUMMARY OF THE INVENTION

According to a first aspect of the present invention, there is provided a charged particle beam apparatus comprising:

a charged particle beam source which generates a charged particle beam to irradiate the charged particle beam onto a specimen;

a demagnification optical system which demagnifies the charged particle beam;

a deflector which deflects the charged particle beam to scan the specimen; and a first charged particle detector having a detection surface to detect a charged particle generated from the specimen which has been irradiated with the charged particle beam;

wherein the detection surface of said first charged particle detector has a rotationally symmetrical form about the center of the optical axis of the charged particle beam and is disposed so as to face the optical axis of the charged particle beam.

According to a second aspect of the present invention, there is provided a charged particle beam apparatus comprising:

a charged particle beam source which generates a charged particle beam to irradiate the charged particle beam onto a specimen;

a demagnification optical system which demagnifies the charged particle beam;

a deflector which deflects the charged particle beam to scan the specimen; and a first charged particle detector having a detection surface to detect a charged particle generated from the specimen which has been irradiated with the charged particle beam;

wherein the detection surface of said first charged particle detector is disposed so as to face towards the charged particle beam source.

According to a third aspect of the present invention, there is provided a method of detecting a charged particle which is used in a charged particle beam apparatus comprising:

a charged particle beam source which generates a charged particle beam and irradiates the charged particle beam onto a specimen; a demagnification optical system which demagnifies the charged particle beam to form an image on the specimen; a deflector which deflects the charged particle beam to scan the surface of the specimen; and a charged particle detector having a detection surface to detect a charged particle which is generated from the specimen which has been irradiated with the charged particle beam; said method comprising:

disposing the detection surface of said charged particle detector in such a manner as to face towards said charged particle beam source; and detecting the charged particle on said detection surface by controlling the trajectory of the charged particle by an electrical field.

According to a fourth aspect of the present invention, there is provided a method of detecting a charged particle which is used in a charged particle beam apparatus comprising:

a charged particle beam source which generates a charged particle beam and irradiates the charged particle beam onto a specimen; a demagnification optical system which demagnifies the charged particle beam to form an image on the specimen; a deflector which deflects the charged particle beam to scan the surface of the specimen; and a charged particle detector having a detection surface which has a rotationally symmetrical form about the center of the optical axis of the charged particle beam and which detects a charged particle which is generated from the specimen which has been irradiated by the charged particle beam; said method comprising:

disposing the detection surface of said charged particle detector in such a manner as to face said optical surface; and detecting said charged particles on said detection surface by controlling the trajectory of the charged particle by an electrical field.

According to a fifth aspect of the present invention, there is provided a method of detecting a charged particle which is generated from a specimen which has been irradiated by a charged particle beam, said method being used in a charged particle beam apparatus comprising:

a charged particle beam source which generates a charged particle beam and irradiates the charged particle beam onto a specimen; a first demagnification optical system which demagnifies the charged particle beam with a first electrical field; a second demagnification optical system which uses a magnetic field or a second electrical field to further demagnify the charged particle beam which has been demagnified by said first demagnification optical system and forms an image on the specimen; and a deflector which deflects the charged particle beam to scan the specimen; said charged particle beam apparatus being connectable to an external power source which applies a retarding potential to the specimen to cause a deceleration in the incident velocity of the charged particle beam toward the specimen; said method comprising:

detecting the charged particle between said first demagnification optical system and said second demagnification optical system when said retarding potential is applied to the specimen, or detecting the charged particle between said second demagnification optical system and the specimen when said retarding potential is not applied to the specimen.

According to a sixth aspect of the present invention, there is provided a method of manufacturing a semiconductor device comprising a method of detecting a charged particle which is used in a charged particle beam apparatus comprising:

a charged particle beam source which generates a charged particle beam and irradiates the charged particle beam onto a specimen; a demagnification optical system which demagnifies the charged particle beam to form an image on the specimen; a deflector which deflects the charged particle beam to scan the surface of the specimen; and a charged particle detector having a detection surface to detect a charged particle which is generated from the specimen which has been irradiated with the charged particle beam; said method of detecting a charged particle including:

disposing the detection surface of said charged particle detector in such a manner as to face towards said charged particle beam source; and detecting the charged particle on said detection surface by controlling the trajectory of the charged particle by an electrical field.

According to a seventh aspect of the present invention, there is provided a method of manufacturing a semiconductor device comprising a method of detecting a charged particle which is used in a charged particle beam apparatus comprising:

a charged particle beam source which generates a charged particle beam and irradiates the charged particle beam onto a specimen; a demagnification optical system which demagnifies the charged particle beam to form an image on the specimen; a deflector which deflects the charged particle beam to scan the surface of the specimen; and a charged particle detector having a detection surface which has a rotationally symmetrical form about the center of the optical axis of the charged particle beam and which detects a charged particle which is generated from the specimen which has been irradiated by the charged particle beam; said method of detecting a charged particle including:

disposing the detection surface of said charged particle detector in such a manner as to face said optical surface; and detecting said charged particles on said detection surface by controlling the trajectory of the charged particle by an electrical field.

According to an eighth aspect of the present invention, there is provided a method of manufacturing a semiconductor device comprising a method of detecting a charged particle which is generated from a specimen which has been irradiated by a charged particle beam, said method being used in a charged particle beam apparatus comprising:

a charged particle beam source which generates a charged particle beam and irradiates the charged particle beam onto a specimen; a first demagnification optical system which demagnifies the charged particle beam with a first electrical field; a second demagnification optical system which uses a magnetic field or a second electrical field to further demagnify the charged particle beam which has been demagnified by said first demagnification optical system and forms an image on the specimen; and a deflector which deflects the charged particle beam to scan the specimen; said charged particle beam apparatus being connectable to an external power source which applies a retarding potential to the specimen to cause a deceleration in the incident velocity of the charged particle beam toward the specimen; said method of detecting a charged particle including:

detecting the charged particle between said first demagnification optical system and said second demagnification optical system when said retarding potential is applied to the specimen, or detecting the charged particle between said second demagnification optical system and the specimen when said retarding potential is not applied to the specimen.

DETAILED DESCRIPTION OF THE INVENTION

Embodiments of the present invention are described below with reference to the accompanying figures. The description below relates to electron beam drawing systems in which an electron beam is used as a charged particle beam and secondary electrons are detected as charged particles obtained when the electron beam irradiates a substrate, respectively, but the present invention is not limited to such a lithography apparatus and thus it can be applied in general to any charged particle beam apparatus. It is of course possible to apply the present invention to the use of an ion beam as the charged beam, by way of example.

(1) FIRST EMBODIMENT

Figure 1:
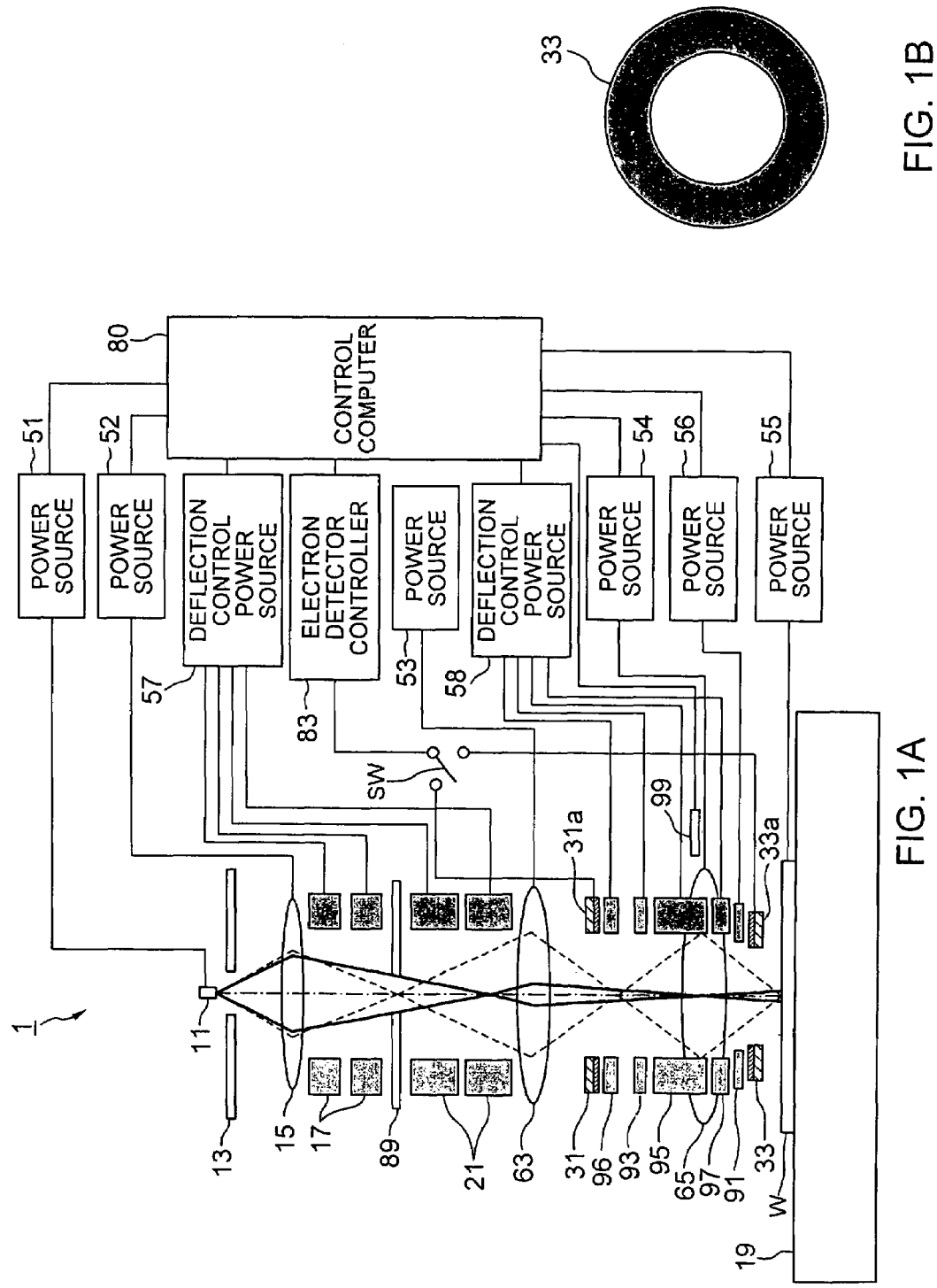
FIG. 1A is a block diagram of a first embodiment of a charged particle beam apparatus in accordance with the present invention.
FIG. 1B is a plan view of a detector disposed between the post main deflector and the wafer, of the secondary electron detectors provided for the charged particle beam apparatus of FIG. 1A.

A block diagram of a first embodiment of the charged particle beam apparatus in accordance with the present invention is shown in FIG. 1A. An electron beam drawing system 1 shown in this figure comprises an electronic optical system, a controller, and an XY stage 19.

The controller includes a control computer 80 that controls the entire system, power sources 51 to 56, deflection control power sources 57 and 58, and an electron detector controller 83 that is specific to this embodiment. The electron detector controller 83 selectively receives signals representative to secondary electrons that have been detected by the secondary electron detectors 31 and 33 (as will be described later), by switching a switch SW, and transfer the signals to the control computer 80 as secondary electron signals that form SEM images. This point will be discussed later. The control computer 80 outputs SEM images by processing these secondary electron signals.

The XY stage 19 holds a wafer W on an upper surface thereof and receives a control signal from a controller (not shown in the figure) to move the wafer W within the X-Y plane.

The electronic optical system includes an electron gun 11 that causes the generation of an electron beam EB, a first aperture 13 having a rectangular or circular opening, an illumination lens 15, a first shaping deflector 17, a shaping aperture (cell aperture) 89, a second shaping deflector 21, a demagnification lens 63, the secondary electron detector 31, an objective lens 65, a pre-main deflector 96, a sub deflector 93, a main deflector 95, a post main deflector 97, a laser displacement sensor 99, a control electrode 91, and a secondary electron detector 33.

The illumination lens 15 is configured of two electrostatic lenses ("Einzel" lens) that are each used by the application of a negative voltage from the power source 52 to an electrode at the center thereof. The illumination lens 15 adjusts the magnification of the electron beam EB to achieve a beam diameter of a necessary size sufficiently large in comparison with the cell pattern of the shaping aperture 89. A plurality of cell apertures are aligned in the shaping aperture 89 in accordance with the shape of a desired pattern to be drawn.

The first shaping deflector 17 controls the deflection of the electron beam EB in such a manner that the electron beam EB that has passed through the illumination lens 15 is incident on the desired cell pattern of the shaping aperture 89.

The second shaping deflector 21 deflects the electron beam EB that has passed through the shaping aperture 89 back to the optical axis. The demagnification lens 63 demagnifies the cell pattern image starting at the shaping aperture 89, and the objective lens 65 further demagnifies the thus-demagnified cell pattern image and forms an image thereof on the wafer W. The pre-main deflector 96, the main deflector 95, and the post main deflector 97 each receive a voltage from the deflection control power source 58 to control the deflection of the electron beam EB in such a manner that it scans a drawing region (a stripe) of the wafer W while referencing the position of the XY stage 19. The sub deflector 93 controls the position at which the electron beam EB is incident, with respect to a drawing region into which the abovementioned stripe has finely been divided.

The two-stage secondary electron detectors 31 and 33 detect secondary electrons generated from the wafer W by the illumination of the electron beam EB. The secondary electron detector 31 is provided between the demagnification lens 63 and the pre-main deflector 96, and is disposed in this embodiment in such a manner that a secondary electron detection surface 31a thereof faces towards the shaping aperture 89 side. The secondary electron detector 33 is disposed between the post main deflector 97 and the wafer W in a rotationally symmetrical manner about the center of the optical axis of the electron beam EB, as shown in the plan view of FIG. 1B, and a secondary electron detection surface 33a thereof is disposed so as to face towards the wafer W side.

The control electrode 91 is disposed between the post main deflector 97 and the secondary electron detector 33 and is connected to the power source 56. The voltage applied to the control electrode 91 is controlled in accordance with the selection of the secondary electron detectors 33 and 31 by the electron detector controller 83, to control the trajectory of the secondary electrons in such a manner that the detection efficiency of the selected secondary electron detector is increased. This point will be discussed later.

The laser displacement sensor 99 measures the distance between the wafer W and the demagnification projection optical system by causing the generation of a laser beam and shining the laser beam at an angle with respect to the upper surface of the wafer W.

The trajectory of the electron beam EB is described briefly below. First of all, the electron beam EB is generated at a low acceleration by the electron gun 11 then, after passing through the first aperture 13, it shines onto the cell pattern of the shaping aperture 89 while the magnification thereof is being adjusted by the illumination lens 15. The electron beam EB that has passed through the illumination lens 15 starts as a cell pattern beam from the starting point of the shaping aperture 89, and passes through the demagnification lens 63 in a state in which it has been back to the optical axis of the optical system by the second shaping deflector 21.

The cell pattern beam starting at the shaping aperture 89 forms a first crossover 9a between the shaping aperture 89 and the demagnification lens 63, the cell pattern image thereof is then magnified by the demagnification lens 63. After that beam has been focused into its smallest diameter at an image position of the demagnification lens 63, it passes through the pre-main deflector 96, the sub deflector 93, the main deflector 95, and the post-main deflector 97. In addition, a second crossover 9b is formed in the vicinity of the center of the objective lens 65, the beam is then projected onto the upper surface of the wafer W by the objective lens 65.

The method of detecting secondary electrons in accordance with the electron beam drawing system 1 of FIG. 1A is described with reference to FIGS. 2 and 3 as follows. In this case, the demagnification lens 63 is configured of an electrostatic lens and the obejective lens 65 is configured of a magnetic lens.

Figure 2:
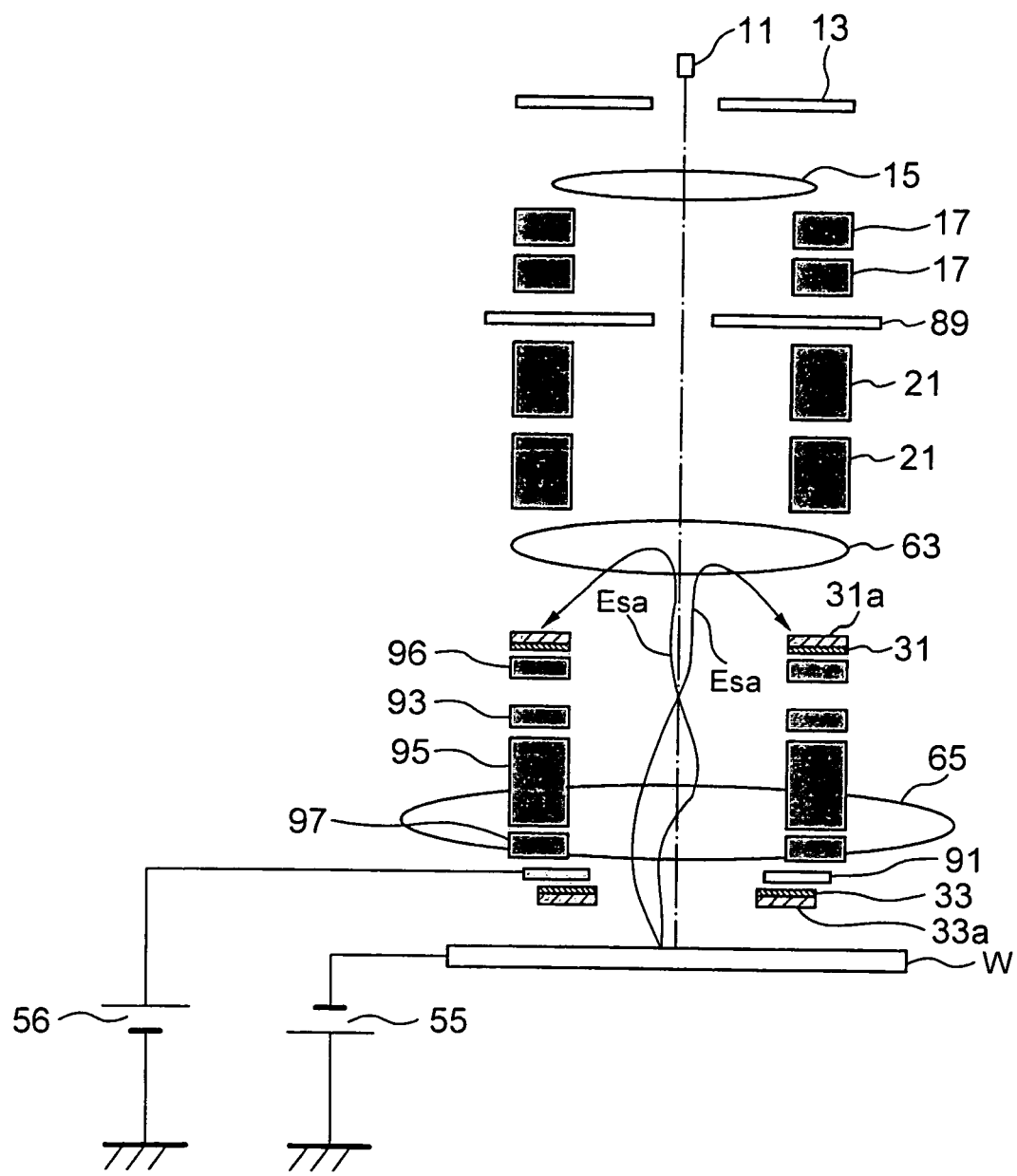
FIGS. 2 and 3 are illustrative of an embodiment of a method of detecting charged particles in accordance with the present invention.

First of all, the electron detector controller 83 switches the switch SW to select the secondary electron detector 31 that is disposed with the detection surface 31a thereof facing towards the shaping aperture 89 side, in a state in which a retarding potential is applied to the wafer W from the power source 55, as shown in FIG. 2. Alternatively, the electron detector controller 83 switches the switch SW to select the secondary electron detector 33 that is disposed with the detection surface 33a facing towards the wafer W side, in a state in which the retarding potential is not applied to the wafer W, as shown in FIG. 3. In this manner, the detection efficiency is increased by selecting the use of the two-stage secondary electron detectors 31 and 33 in accordance with whether or not the retarding potential is applied, making it possible to ensure that a high-quality SEM image is always observed and also simplifying control such as the adjustment of the electron beam. When the retarding potential is applied to the wafer W, secondary electrons ES that are generated from the wafer W pass through the objective lens 65 and then the velocity thereof is decelerated by the potential of the demagnification lens 63 and also the trajectories Esa thereof are changed towards the wafer W as shown in FIG. 2. As a result, the secondary electrons ES are detected by the secondary electron detector 31. Since only the trajectories Esa are changed and the secondary electrons ES are incident on the secondary electron detector 31 without losing energy in the process of being forced back by the potential of the demagnification lens 63, it is not necessary to apply a positive potential to the surface of the detection surface 31a to draw the electrons thereto. Thus, since the secondary electron detector 31 of this embodiment is disposed in such a manner that the detection surface 31a thereof faces towards the cell aperture 89 side and the trajectories Esa of the secondary electrons ES are controlled so that the secondary electrons are detected by the upward-facing detection surface 31a, the secondary electrons ES can be detected at a high efficiency and with a simple configuration.

To increase the detection efficiency of each of the secondary electron detectors 31 and 33, the voltage applied from the power source 56 to the control electrode 91 is controlled in accordance with the selection of the secondary electron detectors 33 and 31 by the electron detector controller 83. When the retarding potential is applied to the wafer W from the power source 55 and the secondary electron detector 31 is selected by the secondary electron detector controller 83, a voltage that is positive with respect to the voltage applied to the wafer W is applied to the control electrode 91 from the power source 56, as shown in FIG. 2, which accelerates the secondary electrons ES generated from the wafer W towards the demagnification lens 63. As a result, the detection efficiency of the secondary electron detector 31 is improved.

Figure 3:
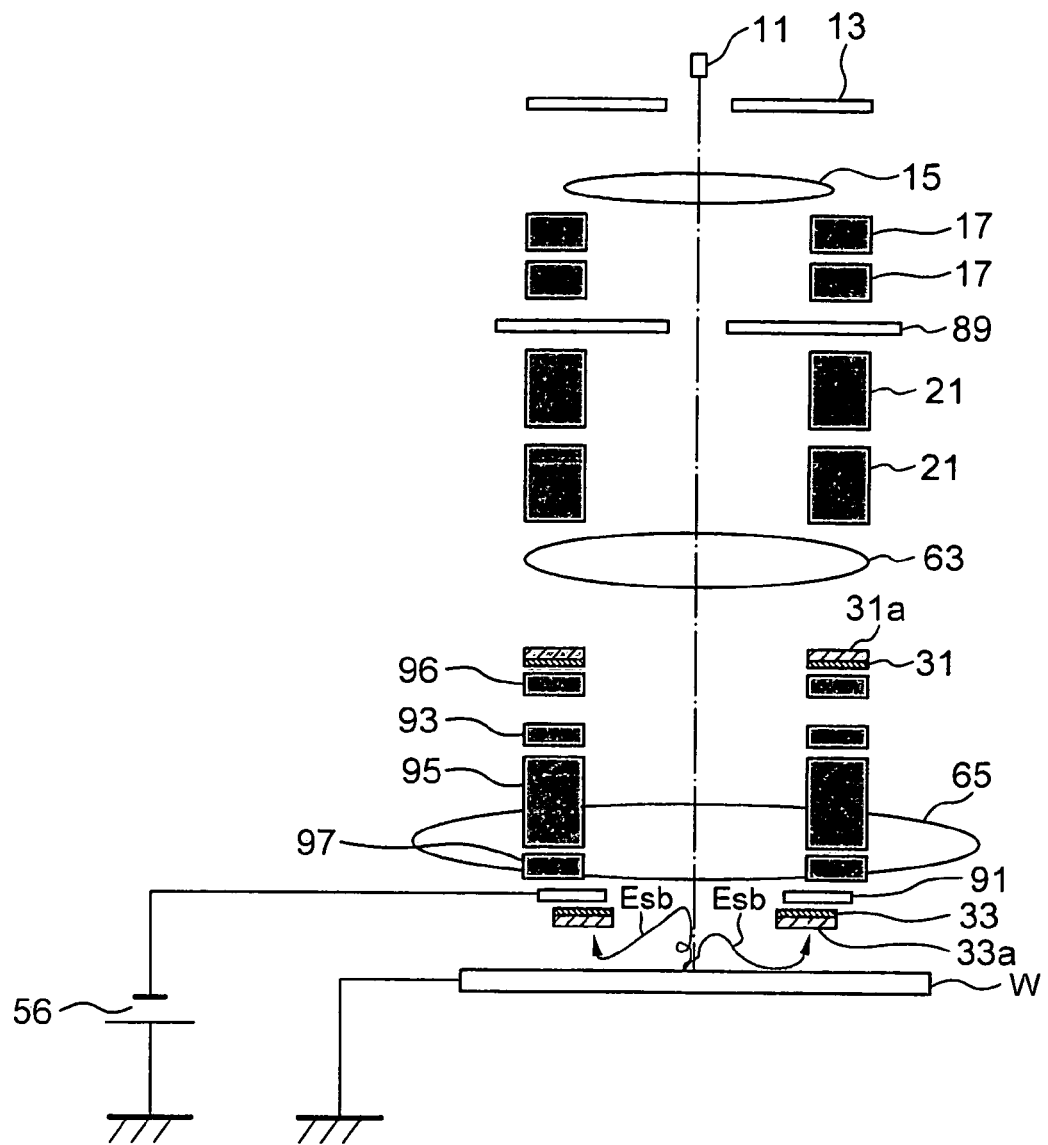

When the retarding potential is not applied to the wafer W and the secondary electron detector 33 is selected by the electron detector controller 83, on the other hand, a negative voltage is applied to the control electrode 91 from the power source 56, as shown in FIG. 3, and thus the secondary electrons ES generated from the wafer W are pressed back and are detected on the detection surface 33a that is disposed so as to face the wafer W side. As a result, the detection efficiency of the secondary electron detector 33 is improved. Since the secondary electrons ES are prevented from intruding into the shaping aperture 89 side from the control electrode 91 in such a case, contamination and charging of the surfaces of the lens and deflection electrodes can be suppressed simultaneously.

Figure 4:
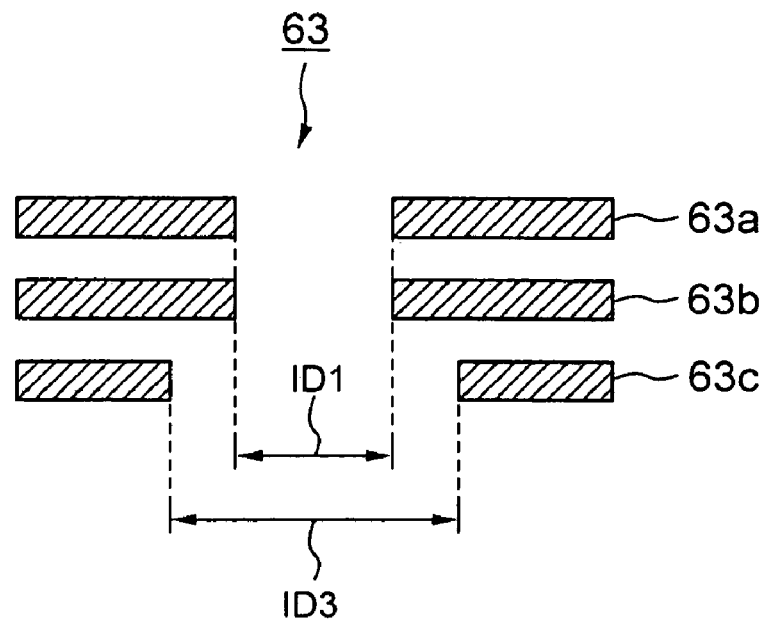
FIG. 4 is an end face view of the electrode configuration of the demagnification lens comprised by the charged particle beam apparatus of FIG. 1A.
Figure 5:
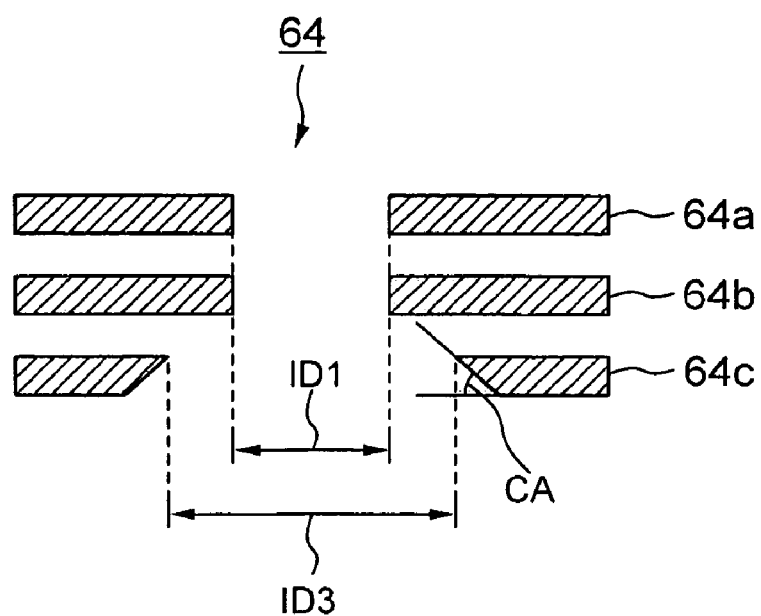
FIG. 5 is an end face view of a variant example of the electrode configuration of FIG. 4.

To further improve the detection efficiency by the secondary electron detector 31 and also make it possible to adjust the acceptance thereof, it is preferable to adjust the permeation of the electrical field generated by the demagnification lens 63 towards the secondary electron detector 31 side (such as the shape and intensity in distribution of the electrical field). For that reason, electrodes 63a to 63c that configure the demagnification lens 63 of this embodiment are adjusted in such a manner that the inner diameter ID3 of the electrode 63c that is positioned closest to the secondary electron detector 31 side is made to be greater than the inner diameter ID1 of the other electrodes 63a and 63b, as shown in FIG. 4. In addition to adjusting the inner diameters in this manner, it is preferable to have the configuration of a variant example 64 shown in FIG. 5, in which an angle of taper CA is provided in the inner wall of an electrode 64 that has an inverted tapered shape as seen from the secondary electron detector 31 side. Instead of these adjustments, or in addition to these adjustments, a potential could be applied to the electrodes 63c and 64c in order to decelerate the velocity of the secondary electrons ES.

In this manner, this embodiment makes it possible to increase the detection efficiency in a state in which a retarding potential is applied, even in an electronic optical system in which the distance between the secondary electron detector 33 and the wafer W is short.

Note that this embodiment was described as being provided with the control electrode 91 that controls the trajectories of secondary electrons in order to increase the detection efficiency of the secondary electron detectors 31 and 33, but the present invention is not limited thereto and thus the above-described potential control could also be performed with respect to the electrode that is positioned closest to the wafer W side among the electrodes of the demagnification lens 63 and the objective lens 65.

Figure 6A:
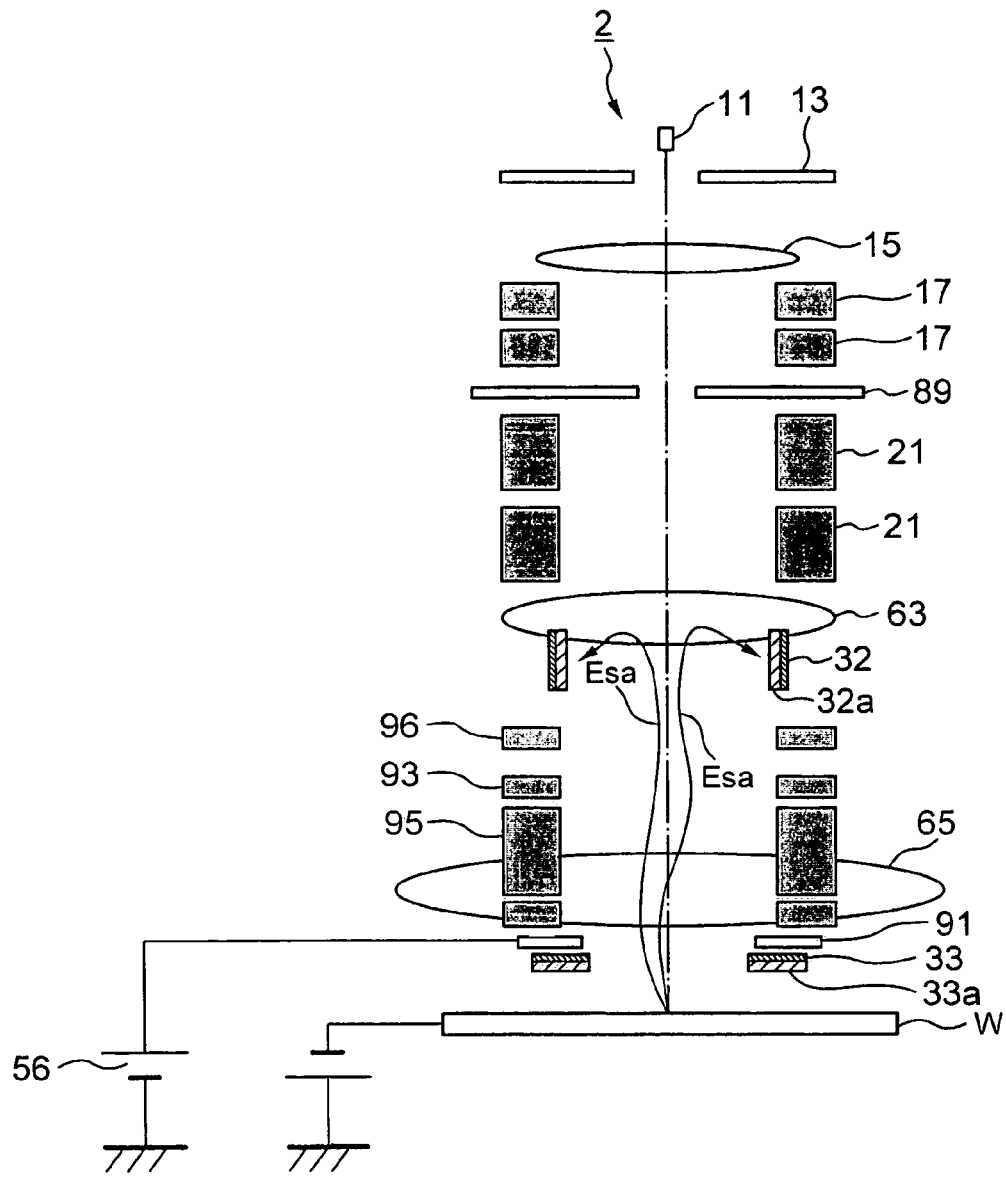
FIG. 6A shows a variant example of the charged particle beam apparatus of FIG. 1A.
Figure 6B:
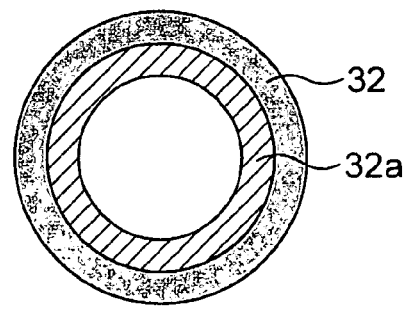
FIG. 6B is a plan view of a detector having a detection surface which is disposed so as to face the optical axis of the electron beam and which has a rotationally symmetrical form about the center of that optical axis, of the secondary electron detectors provided in the charged particle beam apparatus of FIG. 6A.

A block diagram of essential portions of a variant example of the charged particle beam apparatus of this embodiment is shown in FIG. 6A. An electron beam drawing system 2 shown in this figure comprises a secondary electron detector 32 having a detection surface 32a which has a rotationally symmetrical form about the center of the optical axis of the electron beam EB and which is also disposed so as to face the optical axis, instead of the secondary electron detector 31 that is disposed with the detection surface 31a facing towards the cell aperture 89 side. A plan view of the secondary electron detector 32 is shown in FIG. 6B. Since the secondary electrons ES are chased back by the potential of the demagnification lens 63, it is possible to detect the secondary electrons with a similarly high efficiency, even if the detection surface 32a has a rotationally symmetrical form about the center of the optical axis of the electron beam EB and is disposed to face that optical axis, as in this variant example. The rest of the configuration of the electron beam drawing system 2 is substantially the same as that of the electron beam drawing system 1 shown in FIG. 1A.

(2) SECOND EMBODIMENT

Figure 7:
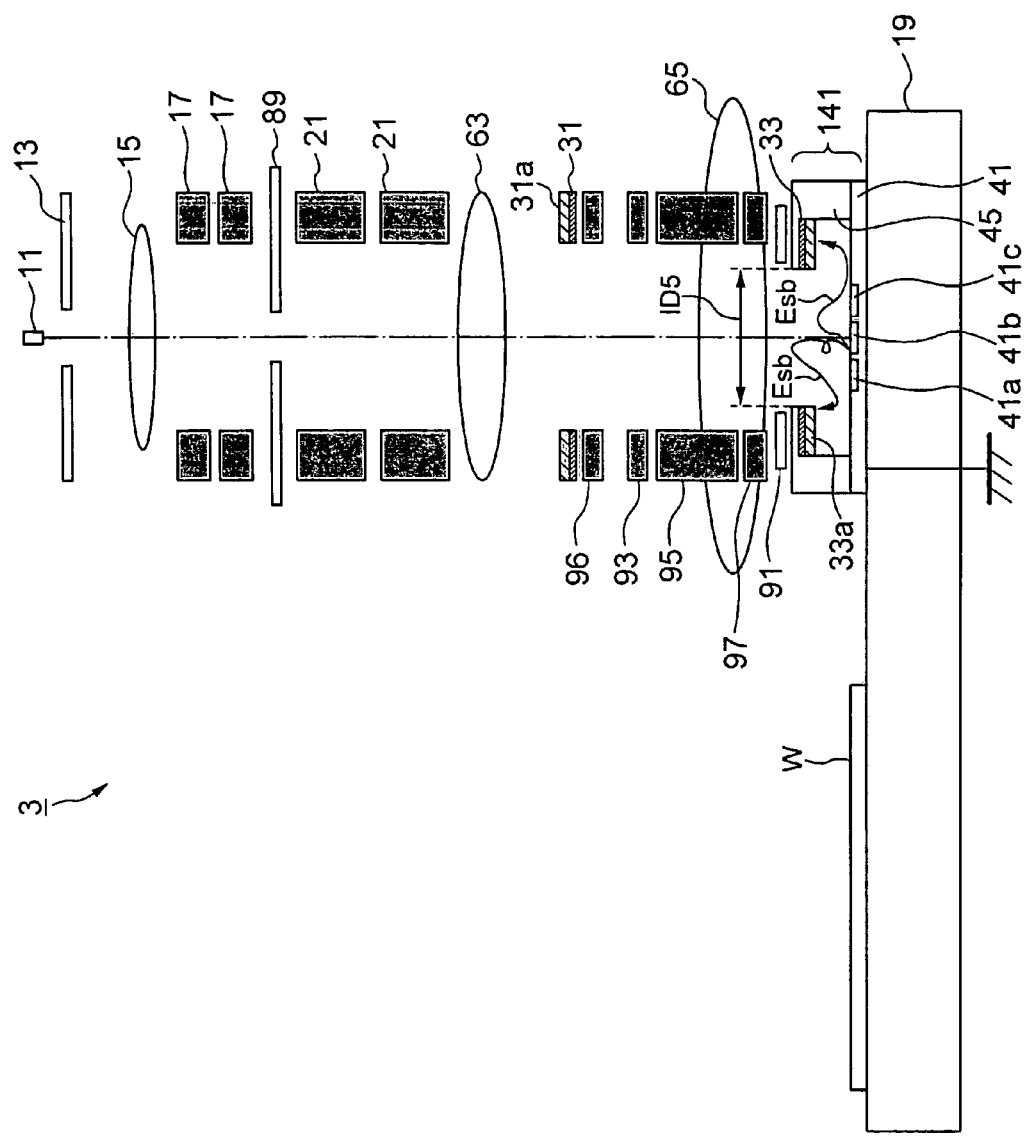
FIG. 7 is a block diagram of essential portions of a second embodiment of the charged particle beam apparatus in accordance with the present invention.
Figure 8:
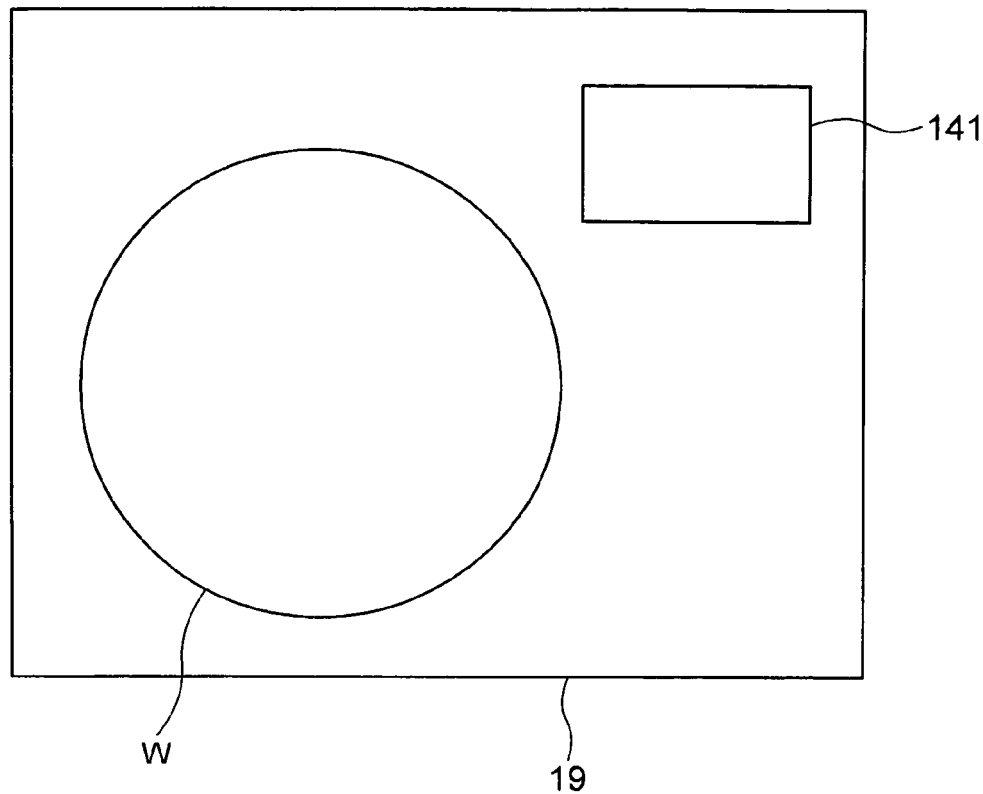
FIG. 8 is a plan view of the XY stage comprised by the charged particle beam apparatus of FIG. 7.

A block diagram of essential portions of a second embodiment of the charged particle beam apparatus in accordance with the present invention is shown in FIG. 7 and a plan view of the XY stage 19 comprised by an electron beam drawing system 3 of FIG. 7 is shown in FIG. 8.

As shown in FIGS. 7 and 8, the electron beam drawing system 3 of this embodiment is characterized in that it comprises an electron beam adjustment/detection unit 141 that is disposed at a distance from the region on the XY stage 19 on which the wafer W is mounted, and the secondary electron detector 33 is formed integrally in that unit 141. The rest of the configuration of the electron beam drawing system 3 is substantially the same as that of the electron beam drawing system 1 shown in FIG. 1A.

Figure 9:
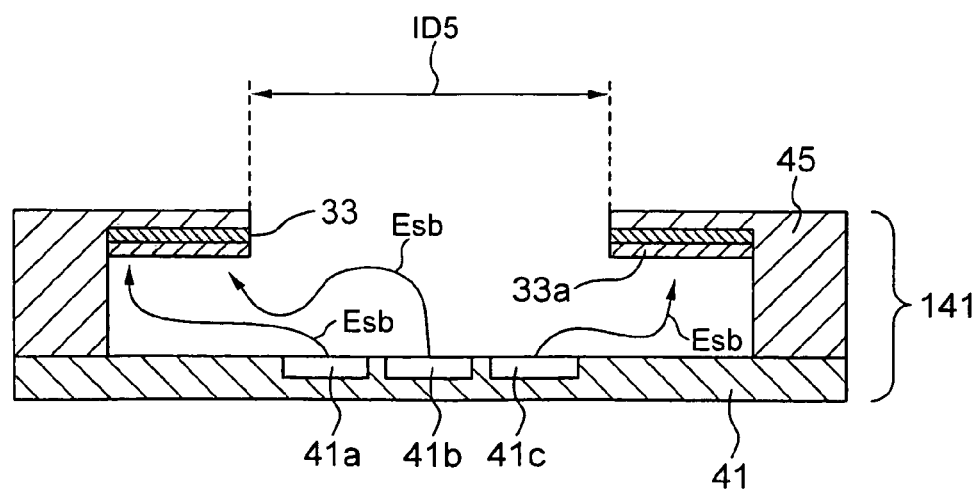
FIG. 9 is an enlarged front view of the electron beam adjustment/detection unit comprised by the charged particle beam apparatus of FIG. 7.
Figure 10:
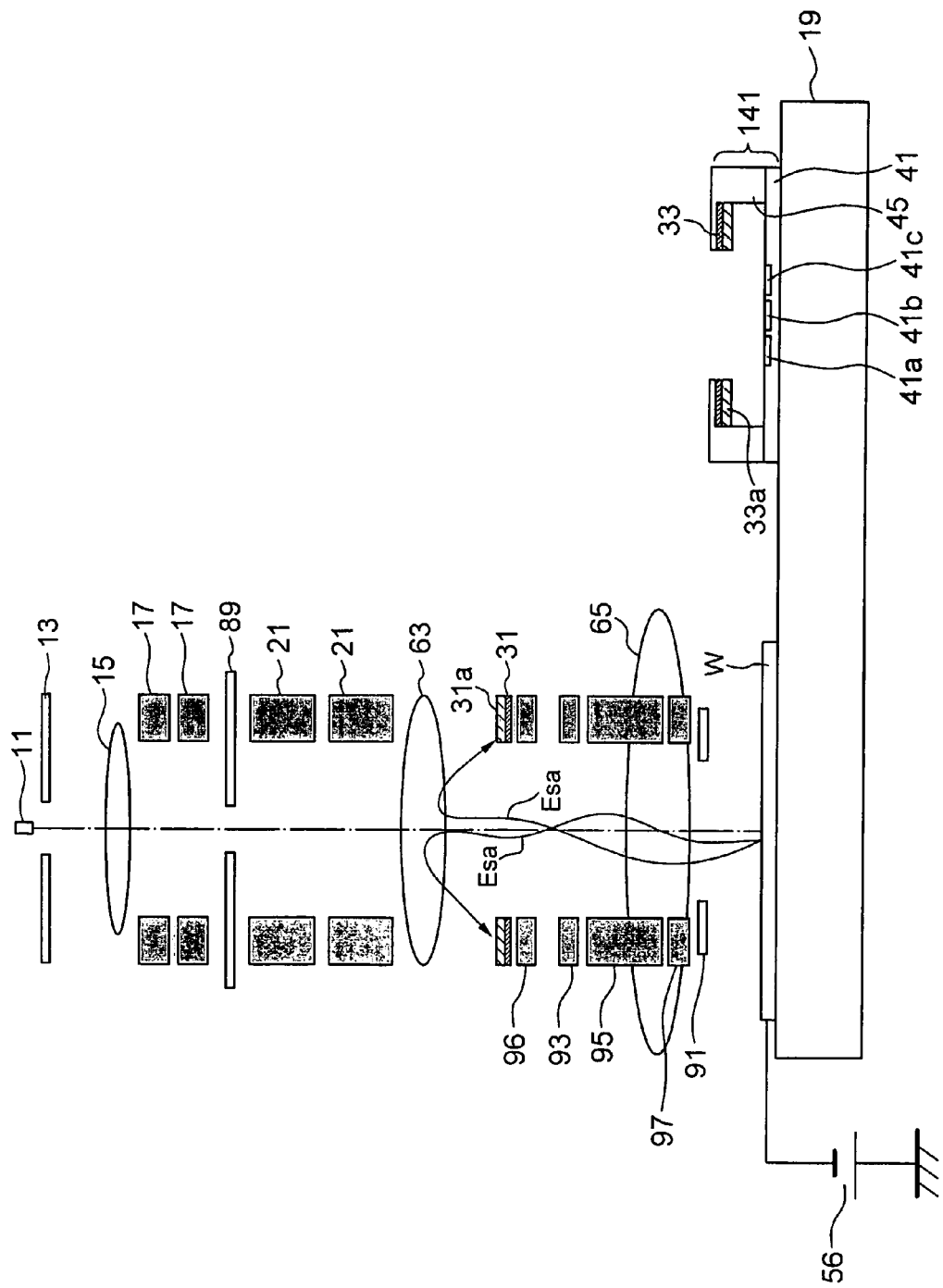
FIG. 10 is a block diagram of an example of the positioning of the electron beam adjustment/detection unit during the process of drawing a pattern on the wafer.

An enlarged front view of the electron beam adjustment/detection unit 141 is shown in FIG. 9. The electron beam adjustment/detection unit 141 includes a beam adjustment specimen 41 having beam adjustment patterns 41a, 41b and 41c formed on an upper surface thereof; a support portion 45 provided at edge portions of the beam adjustment specimen 41 so as to form a side portion of the unit; and the secondary electron detector 33 that is supported on this support portion 45 and is disposed so that the detection surface 33a thereof faces the beam adjustment specimen 41 side. The electron beam adjustment/detection unit 141 is conveyed by the XY stage 19 in such a manner that it is positioned below the objective lens 65 only when the electron beam EB is being adjusted by using the beam adjustment patterns 41a to 41c, to enable adjustment of such as the focus, amount of deflection and astigmatism correction by detection of an SEM image of the beam adjustment patterns 41a to 41c. The secondary electrons generated from the specimen 41 during the adjustment of the electron beam EB follow trajectories Esb shown in FIG. 9, by way of example, and are detected on the detection surface 33a of the secondary electron detector 33. During the step of drawing pattern on the wafer W, the electron beam adjustment/detection unit 141 is conveyed by the XY stage 19 to a position at which it does not obstruct the drawing, so that the drawing step is done in a state such as that shown in FIG. 10.

Figure 11:
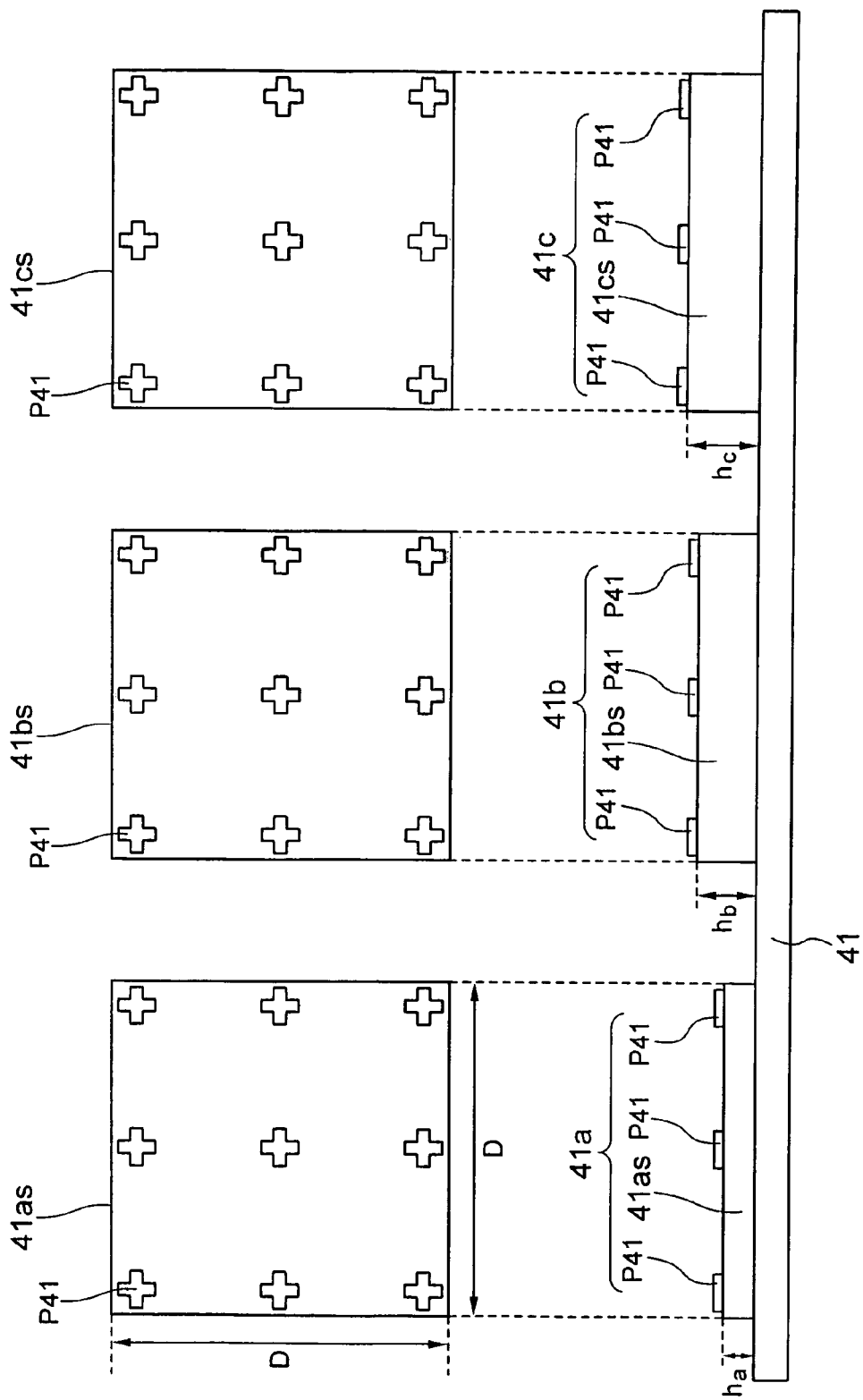
FIG. 11 is an enlarged view of the beam adjustment pattern provided in the electron beam adjustment/detection unit of FIG. 9.

An enlarged view of specific shapes of the beam adjustment patterns 41a to 41c provided on the electron beam adjustment/detection unit 141 is shown in FIG. 11. The beam adjustment patterns 41a to 41c in this embodiment include step portions 41as to 41cs and a plurality of cross-shaped marks P41 that are formed at positions on the upper surfaces of these step portions 41as to 41cs at substantially regular intervals. The step portions 41as to 41cs are formed to have a rectangular plan form where each side is of length D in common, but they have different heights ha to hc, respectively. The cross-shaped marks P41 are formed of a metal material such as tungsten, by way of example. The length D of each side of the rectangle that is the plan-view shape of each step portion corresponds to the deflection range of the main deflection by components such as the main deflector 95. The beam position within the deflection area is adjusted by deflecting the electron beam to scan the cross-shaped marks P41 and obtaining the resultant SEM image. Since the heights ha to hc of the step portions 41as to 41cs are all different in this case, it is possible to adjust the focus conditions for each height and it is also possible to adjust the beam position within the deflection area for each height condition.

Figure 12:
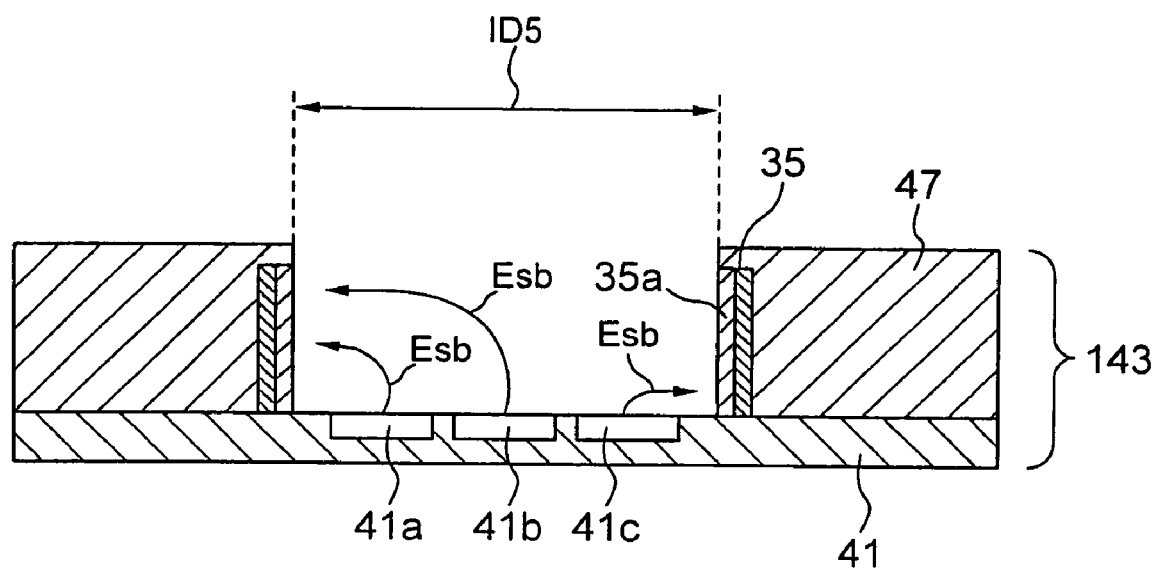
FIG. 12 is an enlarged view of a first variant example of the electron beam adjustment/detection unit of FIG. 9.

An enlarged front view of a first variant example of the electron beam adjustment/detection unit 141 is shown in FIG. 12. An electron beam adjustment/detection unit 143 shown in this figure includes a secondary electron detector 35 that is disposed in such a manner that a detection surface 35a thereof is parallel to the optical axis of the electron beam EB. A configuration having a detection surface disposed parallel to the optical axis in this manner could also be used. The secondary electron detector 35 could have a configuration such that the detection surface 35a thereof has a rotationally symmetrical form about the center of a line parallel to the optical axis of the electron beam EB, as demonstrated by a secondary electron detector 32 in FIG. 6B, by way of example.

Figure 13:
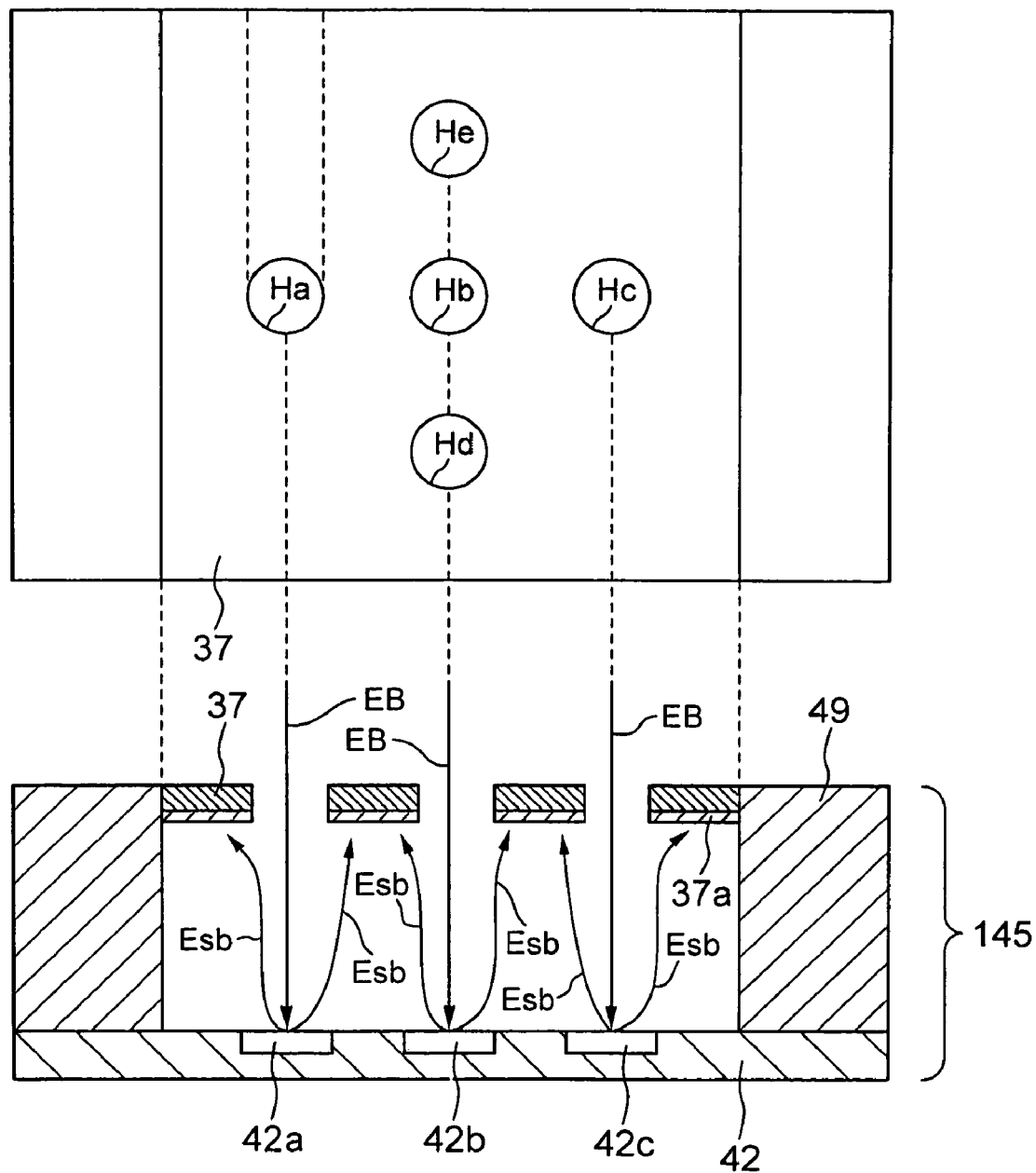
FIG. 13 shows essential portions of a second variant example of the electron beam adjustment/detection unit of FIG. 9.

Essential portions of a second variant example of the electron beam adjustment/detection unit are shown in FIG. 13. An electron beam adjustment/detection unit 145 shown in this figure includes a beam adjustment specimen 42, on which are formed various adjustment patterns 42a to 42c having desired dimensions and shapes, and a secondary electron detector 37 having a detection surface 37a facing towards the beam adjustment specimen 42 side. Apertures Ha to He of dimensions sufficient to enable the electron beam EB to pass therethrough are provided in the secondary electron detector 37 at positions corresponding to the positions of the adjustment patterns 42a to 42c.

If it is desired to increase the dimensions of the beam adjustment patterns or increase the number thereof, the necessity will arise to increase the inner diameter of the aperture provided in the secondary electron detector (such as the inner diameter ID5 shown in FIG. 12 by way of example) so that the electron beam EB can be shone onto all the adjustment patterns. However, if the inner diameter of the aperture is simply increased, the distance between the position at which the electron beam EB is incident and the detection surface of the secondary electron detector could increase and, as a result, the efficiency with which the secondary electrons ES are detected will deteriorate. In such a case, the use of the electron beam adjustment/detection unit 145 of this variant example makes it possible to observe with no drop in detection efficiency, by moving the adjustment patterns onto the optical axis by the XY stage 19, for each observation of the desired adjustment patterns. This makes it possible to remove restrictions on the number and dimensions of the adjustment patterns disposed in the beam adjustment specimen.

Figure 14:
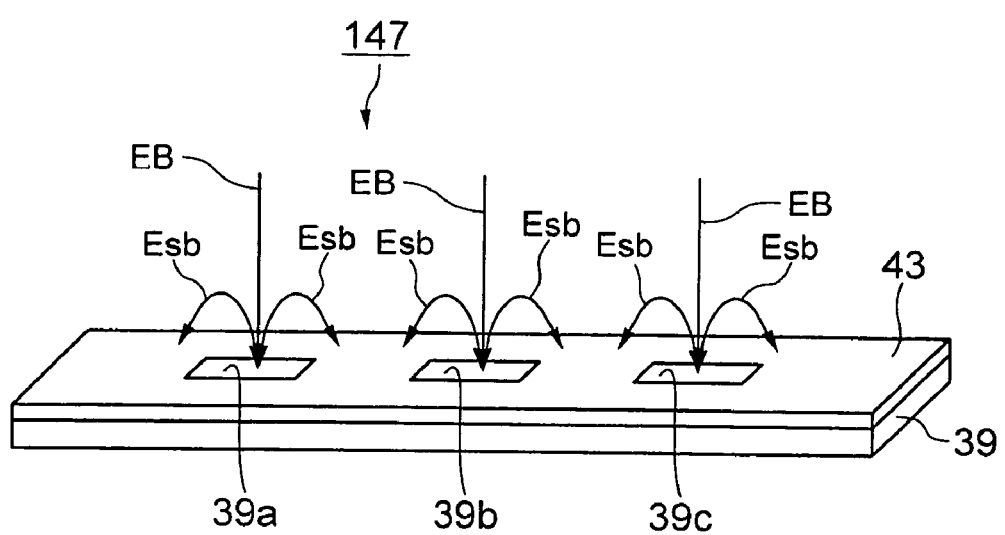
FIG. 14 is a perspective view of a third variant example of the electron beam adjustment/detection unit of FIG. 9.

Essential portions of a third variant example of the electron beam adjustment/detection unit are shown in FIG. 14. An electron beam adjustment/detection unit 147 shown in this figure includes a beam adjustment specimen 39, on which are formed beam adjustment patterns 39a to 39c, and a secondary electron detector 43 which is formed on the upper surface of the beam adjustment specimen 39 so as to surround these beam adjustment patterns 39a to 39c and which has a detection surface facing towards the shaping aperture 89. The electron beam adjustment/detection unit 147 could be formed by attaching the beam adjustment specimen 39 onto the secondary electron detector 43.

Since the secondary electron detector 43 is arranged not away from the XY stage 19 but in contact with the XY stage 19 with the beam adjustment specimen 39 therebetween, the electron beam adjustment/detection unit 147 of this variant example makes it possible to shorten the distance from the objective lens 65 to the wafer W by the distance corresponding to the height of a support portion 47 shown in FIG. 12, by way of example. This makes it possible to greatly improve the optical characteristics.

In the electron beam adjustment/detection unit 147 of FIG. 14, if the dimensions of the beam adjustment patterns 39a to 39c can be reduced to less than the spread of the secondary electrons on the beam adjustment specimen 39 (the trajectories Esb), which are generated from the beam adjustment specimen 39 when the objective lens 65 is configured of a magnetic lens, the detection efficiency can be increased further.

Figure 15:
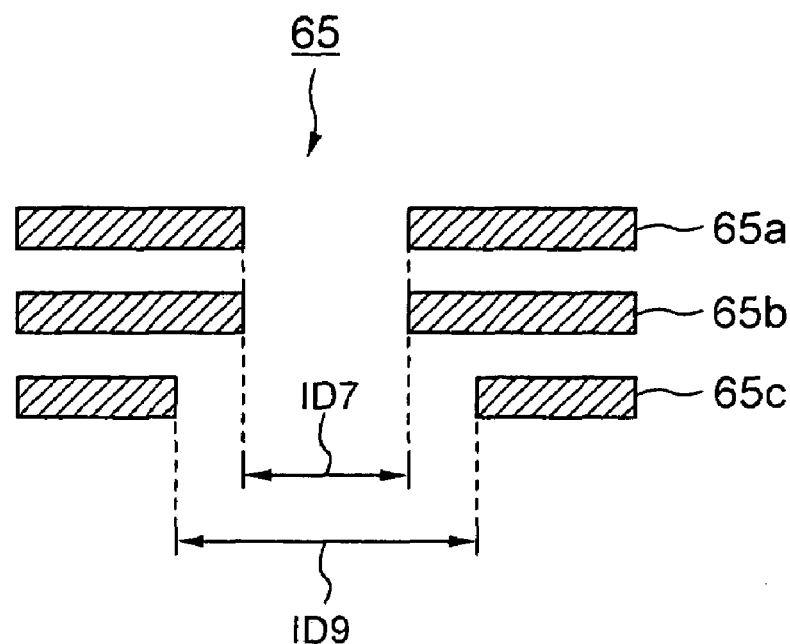
FIG. 15 is an end face view of the electrode configuration of the objective lens comprised by the charged particle beam apparatus of FIG. 7.
Figure 16:
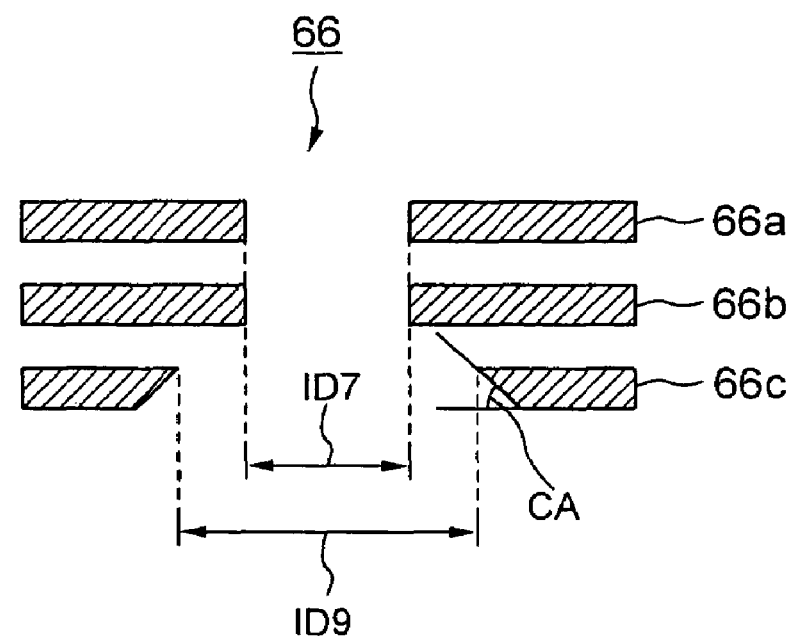
FIG. 16 is an end face view of a variant example of the electrode configuration of FIG. 15.

If the objective lens 65 is configured of an electrostatic lens, on the other hand, the permeation of the electrical field of the objective lens 66 towards the wafer W side (such as the shape and intensity in distribution of the electrical field) can be adjusted to make it possible to further improve the detection efficiency of the secondary electron detector 33, 35, 37, or 43 and to adjust the acceptance thereof by making the inner diameter ID9 of the electrode 65c positioned on the side nearest the wafer W among the electrodes 65a to 65c constituting the objective lens 65 larger than the inner diameter ID7 of the other electrodes, as shown in FIG. 15, or providing the inner wall with an angle of taper CA and adjusting that angle of taper as the objective lens 66 shown in FIG. 16, in a similar manner to the previous discussion relating to the configuration of the demagnification lenses 63 and 64. In a similar manner to that discussed previously with respect to the demagnification lens, a potential could be applied to the electrodes 65c and 66c that are closest to the wafer W side, of the electrodes constituting the objective lenses 65 and 66 to decelerate the velocity of the secondary electrons ES, instead of these adjustments, or in addition to these adjustments.

(3) METHOD OF MANUFACTURING SEMICONDUCTOR DEVICE

Since the use of the above-described method of detecting charged particles in the process of manufacturing a semiconductor device makes it possible to detect charged particles at a high efficiency and also makes it possible to acquire high-quality images of the substrate surface, it enables the manufacture of semiconductor devices with a shorter turn-around time (TAT) and also a high yield.

The present invention has been described above with reference to embodiments thereof, but it should be noted that the present invention is not limited to the above-described examples and thus it can be modified within the scope thereof. The embodiments described above related to applications to a low-acceleration electron beam drawing system, but the present invention can of course be applied to other systems such as a high-acceleration charged particle beam lithography apparatus.

What is claimed is:
1. A charged particle beam apparatus comprising:
    a charged particle beam source which generates a charged particle beam to irradiate the charged particle beam onto a specimen;
    a demagnification optical system which demagnifies the charged particle beam;
    a deflector which deflects the charged particle beam to scan the specimen; and
    a first charged particle detector having a detection surface to detect a charged particle generated from the specimen which has been irradiated with the charged particle beam;
    wherein the detection surface of said first charged particle detector has a rotationally symmetrical form about the center of the optical axis of the charged particle beam and is disposed so as to face the optical axis of the charged particle beam.

2. A charged particle beam apparatus comprising:
a charged particle beam source which generates a charged particle beam to irradiate the charged particle beam onto a specimen;
a demagnification optical system which demagnifies the charged particle beam:
a deflector which deflects the charged particle beam to scan the specimen;
a first charged particle detector having a detection surface to detect a charged particle generated from the specimen which has been irradiated with the charged particle beam, the detection surface of said first charged particle detector being disposed so as to face towards the charged particle beam source;
a movable stage which supports the specimen;
a charged particle beam adjustment specimen arranged on said stage; and
a pattern for adjustment of the charged particle beam formed on said charged particle beam adjustment specimen;
a second charged particle detector arranged between said demagnification optical system and the specimen and having a detection surface to detect a charged particle generated from the specimen which has been irradiated with the charged particle beam, said second charged particle detector being formed integrally with the charged particle beam adjustment specimen and arranged on said stage.

3. The charged particle beam apparatus according to claim 2,
wherein said second charged particle detector is arranged in such a manner that a detection surface thereof faces towards the charged particle beam adjustment specimen.

4. The charged particle beam apparatus according to claim 2, wherein said second charged particle detector has an opening which is provided in correspondence to the position of said pattern for adjustment and which permits the passage of the charged particle beam therethrough.

5. The charged particle beam apparatus according to claim 2,
wherein said second charged particle detector is arranged within substantially the same surface of said charged particle beam adjustment specimen on which said pattern for adjustment is formed, the detection surface of said second charged particle detector facing towards the charged particle beam source.

6. The charged particle beam apparatus according to claim 2,
wherein said second charged particle detector is arranged with the detection surface thereof substantially parallel to the optical axis of the charged particle beam.

7. A charged particle beam apparatus comprising:
a charged particle beam source which generates a charged particle beam to irradiate the charged particle beam onto a specimen;
a demagnification optical system which demagnifies the charged particle beam;
a deflector which deflects the charged particle beam to scan the specimen; and
a first charged particle detector having a detection surface to detect a charged particle generated from the specimen which has been irradiated with the charged particle beam, the detection surface of said first charged particle detector being disposed so as to face towards the charged particle beam source;
wherein said demagnification optical system includes an electrostatic lens having electrodes disposed in a plurality of stages in the direction of said optical axis, and the inner diameter of the electrode positioned on the specimen side of said plurality of stages of electrodes is larger than the inner diameter of the electrode positioned on said charged particle beam source side.

8. The charged particle beam apparatus according to claim 7, comprising:
a second charged particle detector arranged between said demagnification optical system and the specimen and having a detection surface to detect a charged particle generated from the specimen which has been irradiated with the charged particle beam;
a terminal for connection to an external power source to selectively apply a retarding potential to the specimen to cause a deceleration in the incident velocity of the charged particle beam toward the specimen; and
a charged particle detection controller which selectively switches between said first charged particle detector and said second charged particle detector in such a manner that said first charged particle detector is selected when said retarding potential is applied to the specimen and said second charged particle detector is selected when said retarding potential is not applied to the specimen.

9. The charged particle beam apparatus according to claim 7, further comprising:
a second charged particle detector arranged between said demagnification optical system and the specimen and having a detection surface to detect a charged particle generated from the specimen which has been irradiated with the charged particle beam; and
an electrode which is disposed between said second charged particle detector and said demagnification optical system and to which is applied a voltage to control the trajectory of the charged particle.

10. A charged particle beam apparatus comprising:
a charged particle beam source which generates a charged particle beam to irradiate the charged particle beam onto a specimen;
a demagnification optical system which demagnifies the charged particle beam;
a deflector which deflects the charged particle beam to scan the specimen; and
a first charged particle detector having a detection surface to detect a charged particle generated from the specimen which has been irradiated with the charged particle beam, the detection surface of said first charged particle detector being disposed so as to face towards the charged particle beam source;
wherein said demagnification optical system includes an electrostatic lens having electrodes disposed in a plurality of stages in the direction of said optical axis, and the inner wall of the electrode positioned on the specimen side of said plurality of stages of electrodes is formed so as to have a tapered shape as viewed from the specimen.

11. A charged particle beam apparatus comprising:
a charged particle beam source which generates a charged particle beam to irradiate the charged particle beam onto a specimen;
a demagnification optical system which demagnifies the charged particle beam;
a deflector which deflects the charged particle beam to scan the specimen; and a first charged particle detector having a detection surface to detect a charged particle generated from the specimen which has been irradiated with the charged particle beam, the detection surface of said first charged particle detector being disposed so as to face towards the charged particle beam source;

wherein said demagnification optical system includes an electrostatic lens having electrodes disposed in a plurality of stages in the direction of said optical axis, and a source supplying voltage is applied to the electrode positioned on the specimen side of said plurality of stages of electrodes to control the trajectory of the charged particle.

12. A method of detecting a charged particle which is used in a charged particle beam apparatus comprising:

a charged particle beam source which generates a charged particle beam and irradiates the charged particle beam onto a specimen; a demagnification optical system which demagnifies the charged particle beam to form an image on the specimen; a deflector which deflects the charged particle beam to scan the surface of the specimen; and a charged particle detector having a detection surface which has a rotationally symmetrical form about the center of the optical axis of the charged particle beam and which detects a charged particle which is generated from the specimen which has been irradiated by the charged particle beam; said method comprising:

disposing the detection surface of said charged particle detector in such a manner as to face said optical axis; and detecting said charged particles on said detection surface by controlling the trajectory of the charged particle by an electrical field.

13. A method of detecting a charged particle which is generated from a specimen which has been irradiated by a charged particle beam, said method being used in a charged particle beam apparatus comprising:

a charged particle beam source which generates a charged particle beam and irradiates the charged particle beam onto a specimen; a first demagnification optical system which demagnifies the charged particle beam with a first electrical field; a second demagnification optical system which uses a magnetic field or a second electrical field to further demagnify the charged particle beam which has been demagnified by said first demagnification optical system and forms an image on the specimen; and a deflector which deflects the charged particle beam to scan the specimen; said charged particle beam apparatus being connectable to an external power source which applies a retarding potential to the specimen to cause a deceleration in the incident velocity of the charged particle beam toward the specimen; said method comprising:

detecting the charged particle between said first demagnification optical system and said second demagnification optical system when said retarding potential is applied to the specimen, or detecting the charged particle between said second demagnification optical system and the specimen when said retarding potential is not applied to the specimen.

14. The method of detecting a charged particle according to claim 13, wherein the detected quantity and acceptance of the charged particles are adjusted by the distribution of said first electrical field or the distribution of said second electrical field or of said magnetic field.

15. The method of detecting a charged particle according to claim 13, wherein at least one of said first demagnification optical system and said second demagnification optical system has electrodes disposed in a plurality of stages in the direction of said optical axis; and the detected quantity and acceptance of said charged particles are adjusted by the size of the inner diameter of the electrode positioned on the specimen side of said plurality of electrodes of said first or said second demagnification optical system.

16. The method of detecting a charged particle according to claim 13, wherein at least one of said first demagnification optical system and said second demagnification optical system has electrodes disposed in a plurality of stages in the direction of said optical axis;

the electrode positioned on the specimen side of said plurality of stages of electrodes of said first or said second demagnification optical system is formed so as to have an inverted tapered shape facing towards the specimen; and the detected quantity and acceptance of said charged particles are further adjusted by the angle of taper of said inner wall.

17. The method of detecting a charged particle according to claim 13, wherein the specimen is a substrate on which a pattern is to be drawn; and the charged particle beam source generates the charged particle beam at an acceleration voltage which is lower than the voltage which would cause a proximity effect by which the exposure amount of the pattern to be drawn in the vicinity of the position at which the charged particle beam is incident would be affected by a backward scattered electron generated within said substrate by the irradiation of the charged particle beam.

18. A method of manufacturing a semiconductor device comprising a method of detecting a charged particle which is used in a charged particle beam apparatus comprising:

a charged particle beam source which generates a charged particle beam and irradiates the charged particle beam onto a specimen; a demagnification optical system which demagnifies the charged particle beam to form an image on the specimen; a deflector which deflects the charged particle beam to scan the surface of the specimen; and a charged particle detector having a detection surface which has a rotationally symmetrical form about the center of the optical axis of the charged particle beam and which detects a charged particle which is generated from the specimen which has been irradiated by the charged particle beam; said method of detecting a charged particle including:

disposing the detection surface of said charged particle detector in such a manner as to face said optical axis; and detecting said charged particles on said detection surface by controlling the trajectory of the charged particle by an electrical field.

19. A method of manufacturing a semiconductor device comprising a method of detecting a charged particle which is generated from a specimen which has been irradiated by a charged particle beam, said method being used in a charged particle beam apparatus comprising:

a charged particle beam source which generates a charged particle beam and irradiates the charged particle beam onto a specimen; a first demagnification optical system which demagnifies the charged particle beam with a first electrical field; a second demagnification optical system which uses a magnetic field or a second electrical field to further demagnify the charged particle beam which has been demagnified by said first demagnification optical system and forms an image on the specimen; and a deflector which deflects the charged particle beam to scan the specimen; said charged particle beam apparatus being connectable to an external power source which applies a retarding potential to the specimen to cause a deceleration in the incident velocity of the charged particle beam toward the specimen; said method of detecting a charged particle including:

detecting the charged particle between said first demagnification optical system and said second demagnification optical system when said retarding potential is applied to the specimen, or detecting the charged particle between said second demagnification optical system and the specimen when said retarding potential is not applied to the specimen.

* * * * *